United States Patent
Suzuki et al.

(10) Patent No.: US 8,415,604 B2
(45) Date of Patent: Apr. 9, 2013

(54) SOLID-STATE IMAGING DEVICE

(75) Inventors: Hisanori Suzuki, Hamamatsu (JP);
Yasuhito Yoneta, Hamamatsu (JP);
Shinya Otsuka, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/933,992

(22) PCT Filed: Mar. 24, 2009

(86) PCT No.: PCT/JP2009/055809
§ 371 (c)(1),
(2), (4) Date: Oct. 20, 2010

(87) PCT Pub. No.: WO2009/119573
PCT Pub. Date: Oct. 1, 2009

(65) Prior Publication Data
US 2011/0024607 A1 Feb. 3, 2011

(30) Foreign Application Priority Data
Mar. 25, 2008 (JP) ............... P2008-078598

(51) Int. Cl.
*H01L 27/148* (2006.01)
(52) U.S. Cl. ............ 250/208.1; 348/311; 257/230
(58) Field of Classification Search .......... 250/208.1; 348/311–314; 257/229–234, 311–314
See application file for complete search history.

(56) References Cited

U.S. PATENT DOCUMENTS

| | | | | |
|---|---|---|---|---|
| 4,176,369 A * | 11/1979 | Nelson et al. | ............ | 257/228 |
| 5,029,998 A * | 7/1991 | Utagawa et al. | ............ | 396/121 |
| 5,949,099 A | 9/1999 | Yasuda et al. | | |
| 6,721,009 B1 * | 4/2004 | Iizuka | ............ | 348/314 |
| 7,630,007 B2 * | 12/2009 | Murakami | ............ | 348/249 |
| 2002/0057356 A1 | 5/2002 | Tanabe | | |
| 2008/0024638 A1 * | 1/2008 | Murakami | ............ | 348/311 |

FOREIGN PATENT DOCUMENTS

| | | |
|---|---|---|
| EP | 1583150 A1 | 10/2005 |
| EP | 1619723 A1 | 1/2006 |
| JP | S54-024530 | 2/1979 |

(Continued)

*Primary Examiner* — Seung C Sohn
(74) *Attorney, Agent, or Firm* — Drinker Biddle & Reath LLP

(57) ABSTRACT

A solid-state imaging device 1 is provided with a plurality of photoelectric converting portions 3, a plurality of first transferring portions 5, a plurality of charge accumulating portions 7, a plurality of second transferring portions 9, and a shift register 11. Each photoelectric converting portion 3 has a photosensitive region 13 which has a planar shape of a nearly rectangular shape composed of two long sides and two short sides, and a potential gradient forming region 15 which forms a potential gradient increasing along a first direction directed from one short side to the other short side forming the planar shape of the photosensitive region 13. Each first transferring portion 5 is arranged on the side of the other short side forming the planar shape of the corresponding photosensitive region 13 and transfers a charge acquired from the corresponding photosensitive region 13, in the first direction. Each charge accumulating portion 7 accumulates a charge transferred from the corresponding first transferring portion 5. This achieves the solid-state imaging device capable of quickly reading out the charge generated in the photosensitive region, without complicating image processing.

2 Claims, 6 Drawing Sheets

FOREIGN PATENT DOCUMENTS

| | | |
|---|---|---|
| JP | 06283704 A | 10/1994 |
| JP | 8-279608 | 10/1996 |
| JP | 11-27476 | 1/1999 |
| JP | 2000-164847 | 6/2000 |
| JP | 2001-119005 | 4/2001 |
| JP | 2002-231926 | 8/2002 |
| JP | 2003-348458 | 12/2003 |
| JP | 2004-31878 | 1/2004 |
| JP | 2005-164363 | 6/2005 |
| JP | 2005-268564 | 9/2005 |
| JP | 2007-036714 | 2/2007 |

* cited by examiner

SOLID-STATE IMAGING DEVICE

TECHNICAL FIELD

The present invention relates to a solid-state imaging device.

BACKGROUND ART

There is a known solid-state imaging device wherein a plurality of photoelectric converting portions, each of which has a photosensitive region configured to generate a charge according to incidence of light and having a planar shape of a nearly rectangular shape composed of two long sides and two short sides, are arranged in an array form in a one-dimensional direction (direction along the short side direction of the photosensitive region) (e.g., cf. Patent Document 1). The solid-state imaging device of this type has been used heretofore in various uses and is commonly used, particularly, as a light detecting means of a spectroscope.
Patent Document 1: Japanese Patent Application Laid-open No. 2005-164363

DISCLOSURE OF THE INVENTION

Problem to be Solved by the Invention

However, the solid-state imaging device described in Patent Document 1 has the following problem. In the solid-state imaging device described in Patent Document 1, a charge generated in the photosensitive region is read out from the short side of the photosensitive region. For this reason, the generated charge needs to migrate in the long side direction of the photosensitive region and a migration distance thereof is long. As a result of this, it becomes difficult to quickly read out the generated charge.

In the solid-state imaging device described in Patent Document 1, a diffusion region for accumulation of charge and an amplifier region for amplifying and outputting a voltage signal generated in the diffusion region are arranged adjacent to each of a pair of short sides of the photosensitive region. Namely, since the solid-state imaging device described in Patent Document 1 is configured to output respective signals from a pair of amplifier regions arranged adjacent to the respective short sides of the photosensitive region, it is necessary to execute signal processing for obtaining a one-dimensional image. As a result of this, it could complicate image processing.

An object of the present invention is to provide a solid-state imaging device capable of quickly reading out the charge generated in the photosensitive region, without complicating image processing.

Means for Solving the Problem

A solid-state imaging device according to the present invention comprises: a plurality of photoelectric converting portions, each having a photosensitive region which generates a charge according to incidence of light and which has a planar shape of a nearly rectangular shape composed of two long sides and two short sides, and a potential gradient forming region which forms a potential gradient increasing along a first direction directed from one short side to the other short side forming the planar shape of the photosensitive region, in the photosensitive region, the plurality of photoelectric converting portions being juxtaposed along a second direction intersecting with the first direction; a plurality of first transferring portions arranged corresponding to the respective photoelectric converting portions and on the side of the other short side forming the planar shape of the photosensitive region, each first transferring portion transferring a charge acquired from the corresponding photoelectric converting portion, in the first direction; a plurality of charge accumulating portions arranged corresponding to the respective first transferring portions, each charge accumulating portion accumulating a charge transferred from the corresponding first transferring portion; a plurality of second transferring portions arranged corresponding to the respective charge accumulating portions, each second transferring portion transferring a charge accumulated in the corresponding charge accumulating portion, in the first direction; and a charge output portion arranged to the plurality of second transferring portions, the charge output portion transferring and outputting charges transferred from the respective second transferring portions, in the second direction.

In the solid-state imaging device according to the present invention, since the potential gradient increasing along the first direction is formed by the potential gradient forming region in each photoelectric converting portion, the charge generated in the photosensitive region migrates toward the other short side along a slope of potential according to the potential gradient thus formed. The charge having migrated to the other short side is acquired by the first transferring portion to be transferred in the first direction. This makes the charge migration speed dominated by the potential gradient (slope of potential), so as to increase the charge readout speed.

In the present invention, the charge transferred from the first transferring portion is accumulated in the charge accumulating portion and thereafter the charge is transferred in the first direction by the second transferring portion. Then the charges transferred from the respective second transferring portions are transferred in the second direction and output by the charge output portion. As a result of this, the present invention does not have to execute further signal processing for obtaining a one-dimensional image, whereby image processing can be prevented from becoming complicated.

In the present invention, the photosensitive region has the planar shape of the nearly rectangular shape composed of two long sides and two shorts sides. For this reason, a saturated charge quantity is large in the photosensitive region.

In the present invention, preferably, a charge generated in the photoelectric converting portion during a first period and a charge generated in the photoelectric converting portion during a second period shorter than the first period are continuously and alternately output.

When the charge generated in the photoelectric converting portion during the first period is accumulated, an exposure time is relatively long and therefore strong incident light causes saturation of a signal and makes appropriate detection thereof difficult; weak incident light is detected as a sufficiently large signal. On the other hand, when the charge generated in the photoelectric converting portion during the second period is accumulated, an exposure time is relatively short and therefore weak incident light leads to a very weak signal and makes sufficient signal detection difficult; strong incident light is appropriately detected as a signal, without saturation. In this manner, the incident light is appropriately detected as a signal, regardless of the intensity of incident light, so as to increase the effective dynamic range.

Incidentally, the present invention comprises the charge accumulating portions. This permits the charge generated in the photoelectric converting portion during the first period to be accumulated and transferred through the second transferring portion to the charge output portion so as to pose no impediment in transferring the charge generated in the photoelectric converting portion during the second period.

Effect of the Invention

The present invention successfully provides the solid-state imaging device capable of quickly reading out the charge generated in the photosensitive region, without complicating image processing.

DESCRIPTION OF THE SYMBOLS 1 solid-state imaging device; 3 photoelectric converting portions; 5 first transferring portions; 7 charge accumulating portions; 9 second transferring portions; 11 shift register; 13 photosensitive regions; 15 potential gradient forming regions.

BEST MODE FOR CARRYING OUT THE INVENTION

The preferred embodiments of the present invention will be described below in detail with reference to the accompanying drawings. In the description the same elements or elements with the same functionality will be denoted by the same reference symbols, without redundant description.

Figure 1:
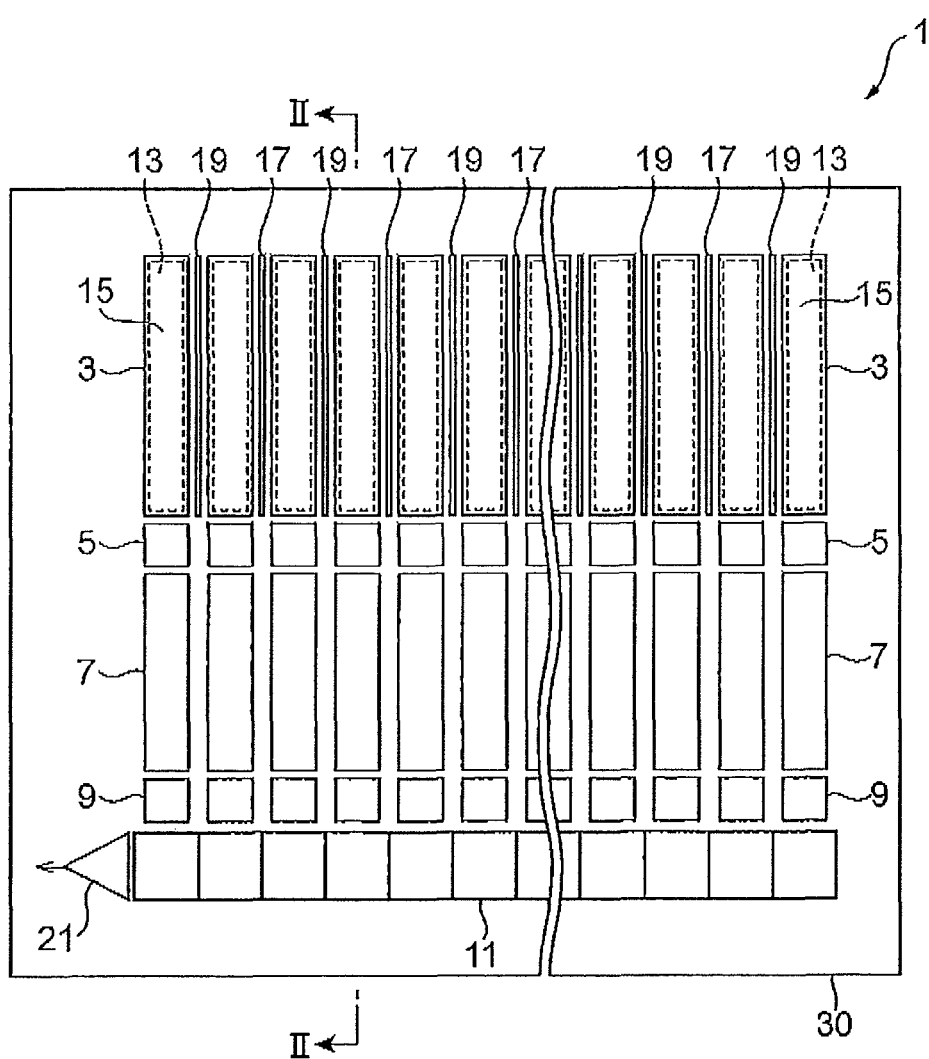
FIG. 1 is a drawing showing a configuration of a solid-state imaging device according to an embodiment of the present invention.
Figure 2:
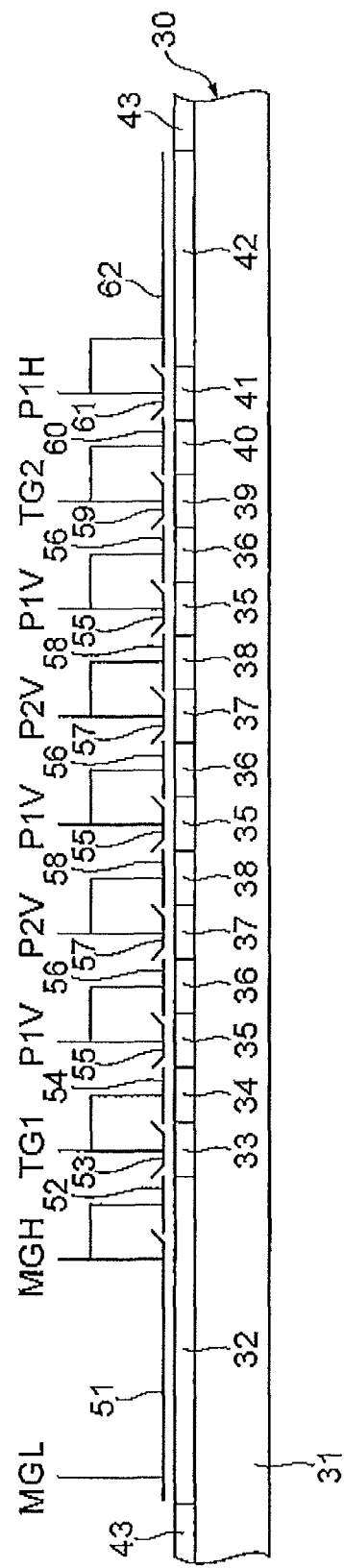
FIG. 2 is a drawing for explaining a sectional configuration along line 11-11 in FIG. 1.

FIG. 1 is a drawing showing a configuration of a solid-state imaging device according to an embodiment of the present invention, FIG. 2 is a drawing for explaining a sectional configuration along line II in FIG. 1.

The solid-state imaging device 1 is provided with a plurality of photoelectric converting portions 3, a plurality of first transferring portions 5, a plurality of charge accumulating portions 7, a plurality of second transferring portions 9, and a shift register 11 as a charge output portion. The solid-state imaging device 1 can be used as a light detecting means of a spectroscope.

Each photoelectric converting portion 3 has a photosensitive region 13 and a potential gradient forming region 15. The photosensitive region 13 senses incidence of light to generate a charge according to an intensity of incident light. The potential gradient forming region 15 forms a potential gradient increasing along a first direction (direction along the long side direction of the photosensitive region 13) directed from one short side to the other short side forming a planar shape of the photosensitive region 13, in the photosensitive region 13. The potential gradient forming region 15 discharges the charge generated in the photosensitive region 13, from the other short side of the photosensitive region 13.

The planar shape of the photosensitive region 13 is a nearly rectangular shape composed of two long sides and two short sides. The plurality of photoelectric converting portions 3 are juxtaposed along a second direction intersecting with the first direction and are arranged in an array form in a one-dimensional direction. The plurality of photoelectric converting portions 3 are juxtaposed in a direction along the short side direction of the photosensitive region 13. In the present embodiment the length in the long side direction of the photosensitive region 13 is set, for example, at about 1 mm. The length in the short side direction of the photosensitive region 13 is set, for example, at about 24 μm.

For each photosensitive region 13, an isolation region 17 and an overflow drain (OFD) region 19 are arranged so as to interpose the photosensitive region 13 between them in the direction along the short side direction of the photosensitive region 13. The isolation region 17 extends in a direction along the long side direction of the photosensitive region 13, while being arranged adjacent to one long side of the photosensitive region 13. The isolation region 17 electrically isolates a pair of photosensitive regions 13 arranged adjacent to each other with the isolation region 17 in between.

The overflow drain region 19 extends in the direction along the long side direction of the photosensitive region 13, while being arranged adjacent to the other long side of the photosensitive region 13. The overflow drain region 19 includes an overflow gate (OFG) composed of a gate transistor, and when a charge is generated over a storage capacitance of the photosensitive region 13 in the photosensitive region 13, the overflow drain region 19 discharges an excess charge over the storage capacitance. This prevents inconvenience such as blooming, a phenomenon in which a charge overflowing from the photosensitive region 13 over the storage capacitance leaks into another photosensitive region 13.

Each first transferring portion 5 is arranged corresponding to a photoelectric converting portion 3 and on the side of the other short side forming the planar shape of the photosensitive region 13. Namely, the plurality of first transferring portions 5 are juxtaposed in the second direction (direction along the short side direction of the photosensitive region 13) on the side of the other short side forming the planar shape of the photosensitive region 13. The first transferring portion 5 acquires a charge discharged from the photosensitive region 13 by the potential gradient forming region 15 and transfers the acquired charge in the first direction. An isolation region (not shown) is arranged between adjacent first transferring portions 5 and the isolation region substantializes electrical isolation between the first transferring portions 5.

Each charge accumulating portion 7 is arranged corresponding to a first transferring portion 5 and adjacent to the first transferring portion 5 in the first direction. Namely, the plurality of charge accumulating portions 7 are juxtaposed in the second direction on the side of the other short side forming the planar shape of the photosensitive region 13. The charge accumulating portion 7 sequentially accumulates charges transferred from the corresponding first transferring portion 5. An isolation region (not shown) is arranged between adjacent charge accumulating portions 7 and the isolation region substantializes electrical isolation between the charge accumulating portions 7.

Each second transferring portion 9 is arranged corresponding to a charge accumulating portion 7 and adjacent to the charge accumulating portion 7 in the first direction. Namely, the plurality of second transferring portions 9 are juxtaposed in the second direction on the side of the other short side forming the planar shape of the photosensitive region 13. The second transferring portion 9 acquires a charge accumulated in the corresponding charge accumulating portion 7 and transfers the acquired charge in the first direction. An isolation region (not shown) is arranged between adjacent second transferring portions 9 and the isolation region substantializes electrical isolation between the second transferring portions 9.

The shift register 11 is arranged to the plurality of second transferring portions 9 so as to be adjacent in the first direction to each second transferring portion 9. The shift register 11 receives charges transferred from the respective second transferring portions 9 and transfers them in the second direction to successively output them to an amplifier portion 21. The charges output from the shift register 11 are converted into voltages by the amplifier portion 21 and the voltages of the respective photoelectric converting portions 3 (photosensitive regions 13) arranged in the second direction are output to the outside of the solid-state imaging device 1.

The plurality of photoelectric converting portions 3, the plurality of first transferring portions 5, the plurality of charge accumulating portions 7, the plurality of second transferring portions 9, and the shift register 11 are formed on a semiconductor substrate 30, as shown in FIG. 2. The semiconductor substrate 30 includes a p-type semiconductor layer 31 as a base of the semiconductor substrate 30, n-type semiconductor layers 32, 34, 36, 38, 40, and 42, n$^-$-type semiconductor layers 33, 35, 37, 39, and 41, and a p$^+$-type semiconductor layer 43 which are formed on one side of the p-type semiconductor layer 31. In the present embodiment, Si is used as a semiconductor, "high impurity concentration" refers, for example, to an impurity concentration of not less than about $1\times10^{17}$ cm$^{-3}$ and is indicated by "+" attached to the conductivity type, and "low impurity concentration" refers to an impurity concentration of not more than about $1\times15^{15}$ cm$^{-3}$ and is indicated by "−" attached to the conductivity type. An n-type impurity is, for example, arsenic and a p-type impurity is, for example, boron.

The p-type semiconductor layer 31 and the n-type semiconductor layer 32 form a pn junction and the n-type semiconductor layer 32 constitutes the photosensitive region 13 which generates a charge with incidence of light. The n-type semiconductor layer 32, on a plan view, is of a nearly rectangular shape composed of two long sides and two short sides. A plurality of n-type semiconductor layers 32 are juxtaposed along the second direction intersecting with the foregoing first direction (i.e., the direction along the long side direction of the n-type semiconductor layer 32 as directed from one short side to the other short side forming the planar shape of the n-type semiconductor layer 32) and are arranged in an array form in a one-dimensional direction. The n-type semiconductor layers 32 are juxtaposed in the direction along the short side direction of the n-type semiconductor layer 32. The aforementioned isolation region 17 can be composed of a p$^+$-type semiconductor layer.

A pair of electrodes 51, 52 are arranged for the n-type semiconductor layer 32. The pair of electrodes 51, 52 are made of an optically transparent material, e.g., a polysilicon film and are formed through an insulating layer (not shown) on the n-type semiconductor layer 32. The pair of electrodes 51, 52 constitute the potential gradient forming region 15. The electrodes 51, 52 may be formed as continuously extending in the second direction so as to stretch across a plurality of n-type semiconductor layers 32 juxtaposed along the second direction. The electrodes 51, 52 may be formed for each of the n-type semiconductor layers 32.

The electrode 51 constitutes a so-called resistive gate and is formed so as to extend in the direction (the aforementioned first direction) directed from one short side to the other short side forming the planar shape of the n-type semiconductor layer 32. The electrode 51 is given a constant potential difference at its two ends, to form a potential gradient according to an electric resistance component in the first direction of the electrode 51, i.e., a potential gradient increasing along the first direction. A control circuit (not shown) supplies a signal MGL to one end of the electrode 51 and the control circuit (not shown) supplies a signal MGH to the other end of the electrode 51 and to the electrode 52. When the signals MGL, MGH are H level, the potential gradient increasing along the foregoing first direction is formed in the n-type semiconductor layer 32.

A pair of transfer electrodes 53, 54 are arranged adjacent in the first direction to the electrode 52. The transfer electrodes 53, 54 are formed through an insulating layer (not shown) on the n$^-$-type semiconductor layer 33 and on the n-type semiconductor layer 34, respectively. The n$^-$-type semiconductor layer 33 and the n-type semiconductor layer 34 are arranged on the side of the other short side forming the planar shape of the n-type semiconductor layer 32. The transfer electrodes 53, 54 are comprised, for example, of a polysilicon film. The transfer electrodes 53, 54 are given a signal TG1 from the control circuit (not shown). The transfer electrodes 53, 54 and the n$^-$-type semiconductor layer 33 and the n-type semiconductor layer 34 below the transfer electrodes 53, 54 constitute the first transferring portion 5.

Plural pairs (five pairs in the present embodiment) of electrodes 55-58 are arranged adjacent in the first direction to the transfer electrode 54. The electrodes 55-58 are arranged in order in the first direction and are formed through an insulating layer (not shown) on the n$^-$-type semiconductor layer 35, on the n-type semiconductor layer 36, on the n$^-$-type semiconductor layer 37, and on the n-type semiconductor layer 38, respectively. The electrodes 55-58 are comprised, for example, of a polysilicon film. The electrodes 55, 56 are given a signal NV from the control circuit (not shown) and the electrodes 57, 58 are given a signal P2V from the control circuit (not shown). The electrodes 55-58 and the n$^-$-type semiconductor layers 35, 37 and the n-type semiconductor layers 36, 38 below the electrodes 55-58 constitute the charge accumulating portion 7.

A pair of transfer electrodes 59, 60 are arranged adjacent in the first direction to the electrode 56. The transfer electrodes 59, 60 are formed through an insulating layer (not shown) on the n$^-$-type semiconductor layer 39 and on the n-type semiconductor layer 40, respectively. The n$^-$-type semiconductor layer 39 and the n$^-$-type semiconductor layer 40 are arranged adjacent in the first direction to the n-type semiconductor layer 36 located at the rearmost position in the first direction among the electrodes 55-58. The transfer electrodes 59, 60 are comprised, for example, of a polysilicon film. The transfer electrodes 59, 60 are given a signal TG2 from the control circuit (not shown). The transfer electrodes 59, 60 and the n$^-$-type semiconductor layer 39 and the n-type semiconductor layer 40 below the transfer electrodes 59, 60 constitute the second transferring portion 9.

A pair of transfer electrodes 61, 62 are arranged adjacent in the first direction to the transfer electrode 60. The transfer electrodes 61, 62 are formed through an insulating layer (not shown) on the n$^-$-type semiconductor layer 41 and on the n-type semiconductor layer 42, respectively. The n$^-$-type semiconductor layer 41 and the n-type semiconductor layer 42 are arranged adjacent in the first direction to the n-type semiconductor layer 40. The transfer electrodes 61, 62 are comprised, for example, of a polysilicon film. The transfer electrodes 61, 62 are given a signal, P1H from the control circuit (not shown). The transfer electrodes 61, 62 and the n$^-$-type semiconductor layers 41 and the n-type semiconductor layers 42 below the transfer electrodes 61, 62 constitute the shift register 11.

The p+-type semiconductor layer 43 electrically isolates the n-type semiconductor layers 32, 34, 36, 38, 40, 42 and the n−-type semiconductor layers 33, 35, 37, 39, 41 from the other portions of the semiconductor substrate 30. Each of the aforementioned insulating layers is made of an optically transparent material, e.g., a silicon oxide film. In order to prevent occurrence of unwanted charge, the n-type semiconductor layers 34, 36, 38, 40, 42 and the n−-type semiconductor layers 33, 35, 37, 39, 41 (first transferring portion 5, charge accumulating portion 7, second transferring portion 9, and shift register 11) except for the n-type semiconductor layer 32 are preferably shielded from light, for example, by arranging a light shield member.

Figure 3:
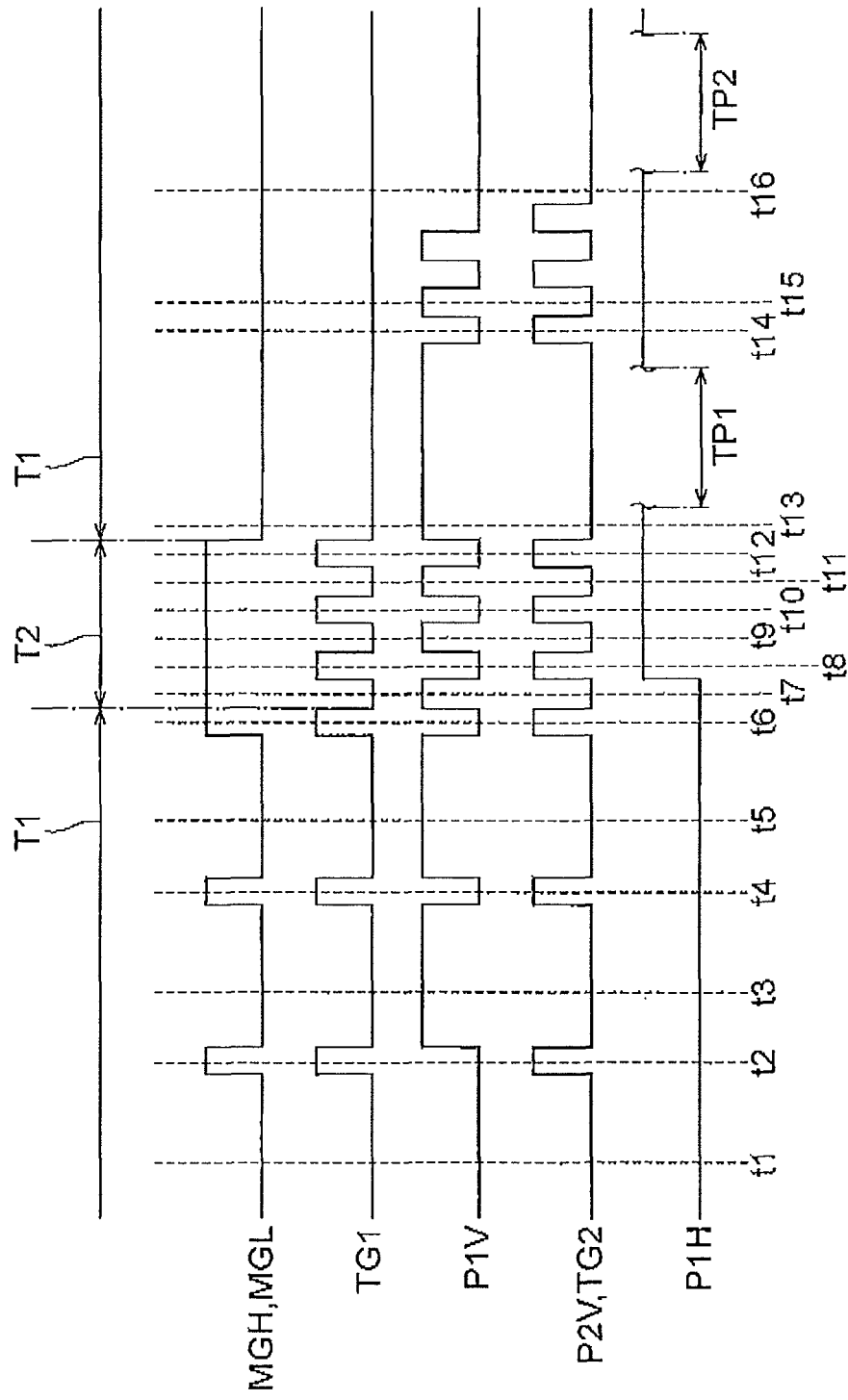
FIG. 3 is a timing chart of input signals in the solid-state imaging device according to the embodiment.
Figure 4:
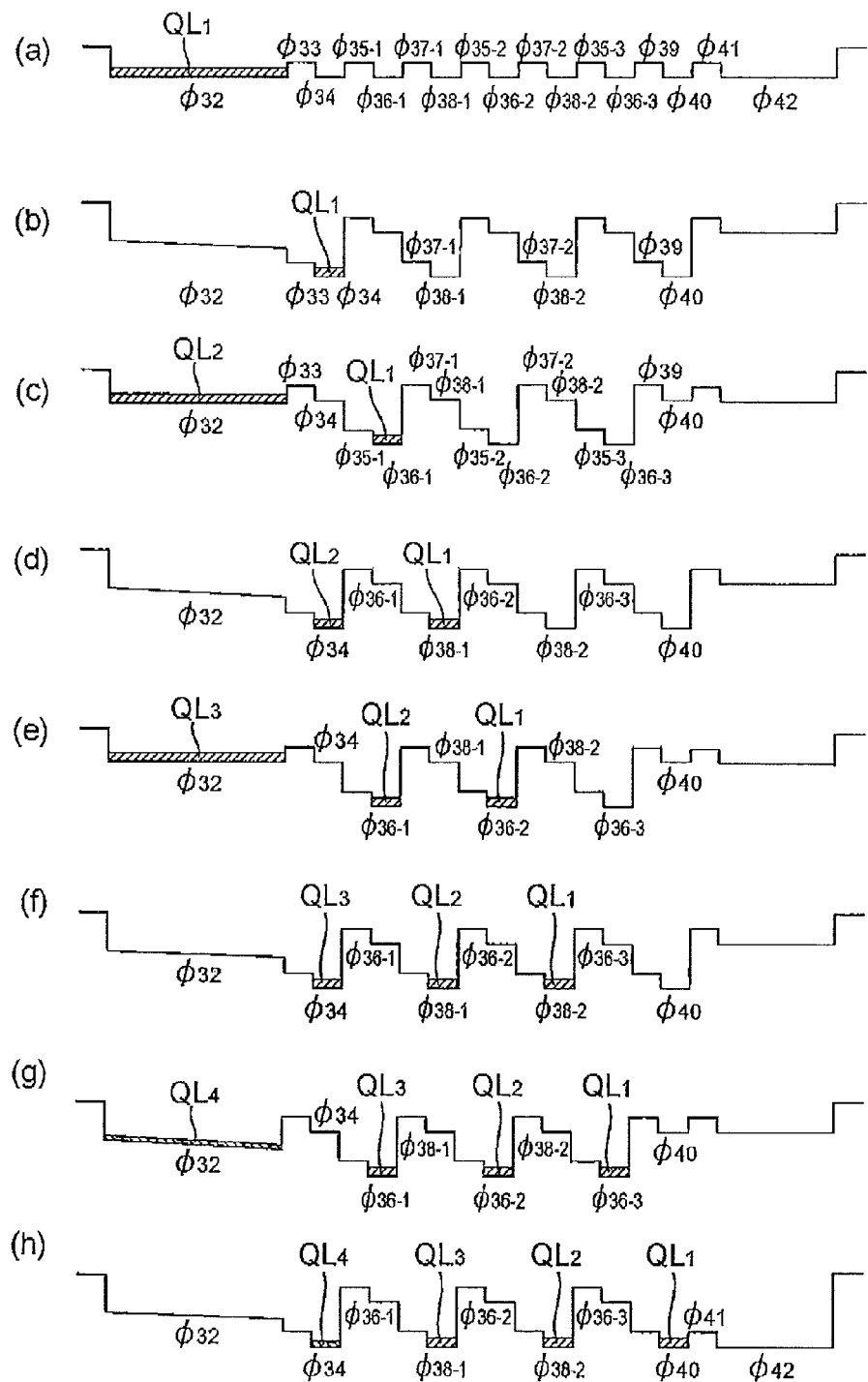
FIG. 4 is potential diagrams for explaining charge accumulating and discharging operations at respective times in FIG. 3.
Figure 5:
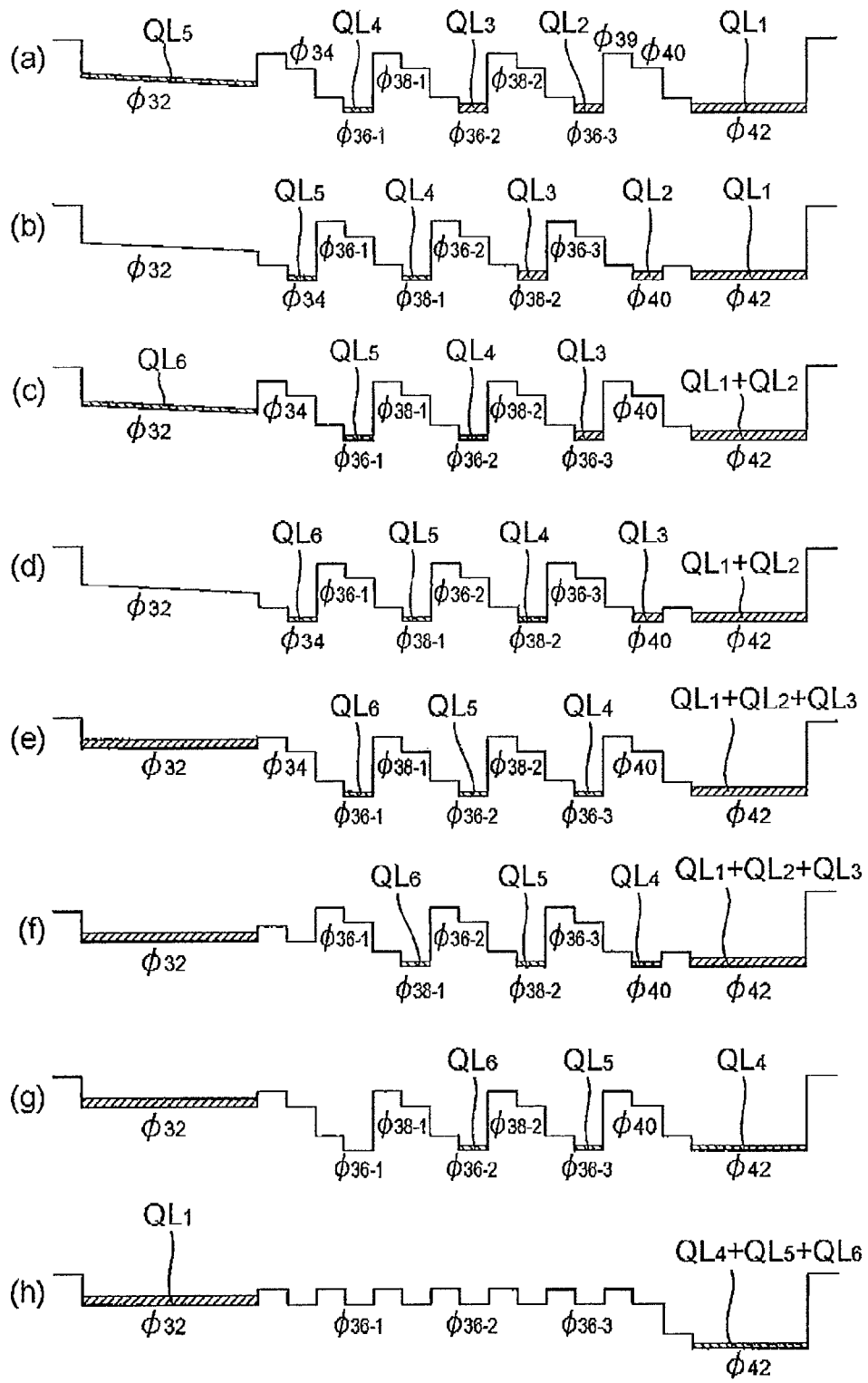
FIG. 5 is potential diagrams for explaining charge accumulating and discharging operations at respective times in FIG. 3.
Figure 6:
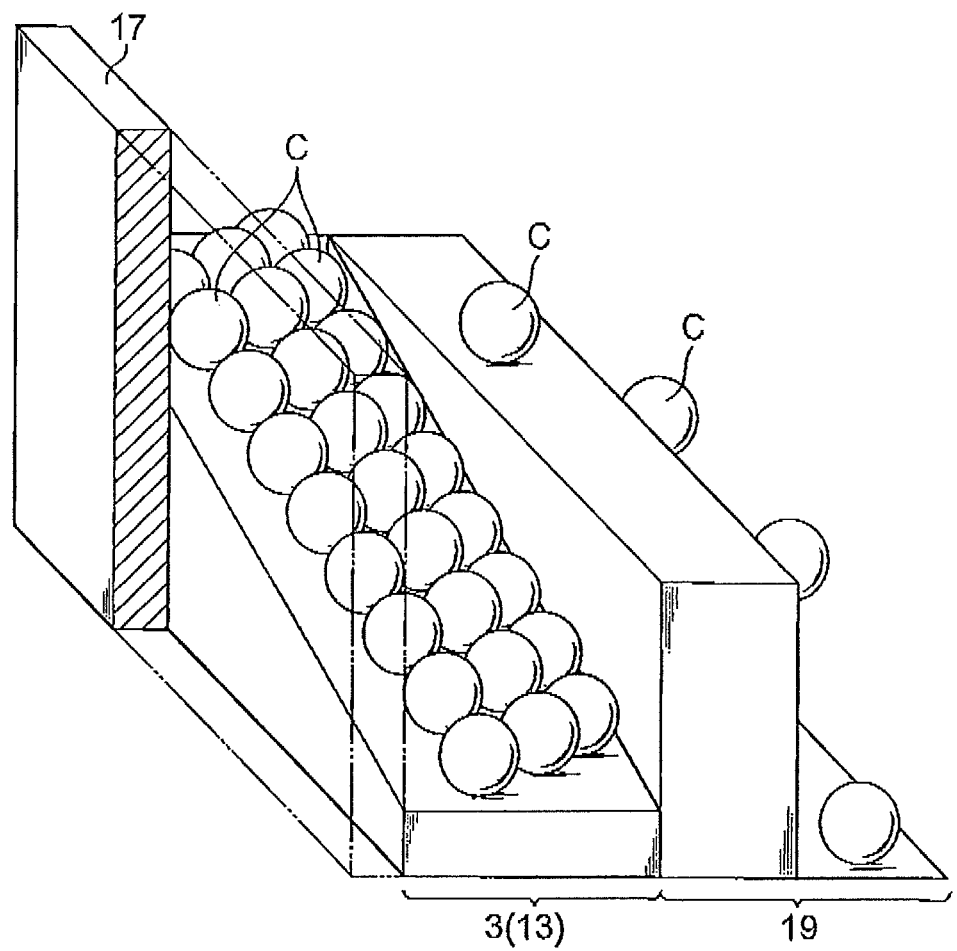
FIG. 6 is a schematic diagram for explaining migration of charge in a photoelectric converting portion.

The operations in the solid-state imaging device 1 will be described below on the basis of FIGS. 3 to 6. FIG. 3 is a timing chart of the signals MGL, MGH, TG1, P1V, P2V, TG2, and P1H fed to the electrodes 51-62 in the solid-state imaging device 1 of the present embodiment. FIG. 4 (a) to (h) and FIG. 5 (a) to (h) are potential diagrams for explaining charge accumulating and discharging operations at respective times t1-t16 in FIG. 3, FIG. 6 is a schematic diagram for explaining migration of charge in a photoelectric converting portion.

Incidentally, positively ionized donors exist in an n-type semiconductor and negatively ionized acceptors exist in a p-type semiconductor. The potential in the n-type semiconductor becomes higher than that in the p-type semiconductor. In other words, the potential in an energy band diagram is positive in the downward direction and therefore the potential in the n-type semiconductor becomes deeper (or higher) than the potential in the p-type semiconductor in the energy band diagram and has a lower energy level. When a positive potential is applied to each electrode, a potential of a semiconductor region immediately below the electrode becomes deeper (or increases in the positive direction). When the magnitude of the positive potential applied to each electrode is reduced, the potential of the semiconductor region immediately below the corresponding electrode becomes shallower (or decreases in the positive direction).

As shown in FIG. 3, at time t1 the signals MGL, MGH, TG1, P1V, P2V, TG2, P1H are L level, whereby the potential $\Phi_{32}$ of the n-type semiconductor layer 32 is deeper than the potential $\Phi_{33}$ of the n−-type semiconductor layer 33, thus forming a well of the potential $\Phi_{32}$ (cf., FIG. 4 (a)). In this state, when light is incident to the n-type semiconductor layer 32 to generate a charge, the generated charge is accumulated in the well of the potential $\Phi_{32}$. A charge quantity $QL_1$ is accumulated in the potential $\Phi_{32}$.

At time t2, the signals MGL, MGH are H level, whereby the potential gradient increasing in the first direction is formed in the n-type semiconductor layer 32 and the potential $\Phi_{32}$ is inclined so as to deepen toward the n−-type semiconductor layer 33, thereby forming the gradient of the potential $\Phi_{32}$ (cf. FIG. 4 (b)). At the same time t2, the signals TG1, P2V, TG2 are H level to deepen each of the potentials $\Phi_{33}$, $\Phi_{34}$ of the n−-type semiconductor layer 33 and the n-type semiconductor layer 34, the potentials $\Phi_{37-1}$, $\Phi_{37-2}$, $\Phi_{38-1}$, $\Phi_{38-2}$ of the n−-type semiconductor layers 37 and the n-type semiconductor layers 38, and the potentials $\Phi_{39}$, $\Phi_{40}$ of the n−-type semiconductor layer 39 and the n-type semiconductor layer 40, thereby forming respective wells of the potentials $\Phi_{34}$, $\Phi_{38-1}$, $\Phi_{38-2}$, $\Phi_{40}$. The charge C accumulated in the well of the potential $\Phi_{32}$ migrates along the gradient of the potential $\Phi_{32}$, as also shown in FIG. 5, to be transferred into the well of the potential $\Phi_{34}$. The charge quantity $QL_1$ is accumulated in the potential $\Phi_{34}$.

At time t3, the signals MGL, MGH, TG1 are L level to eliminate the gradient of the potential $\Phi_{32}$ and shallow the potentials $\Phi_{33}$, $\Phi_{34}$ (cf FIG. 4 (c)). This causes a generated charge to be accumulated in the well of the potential $\Phi_{32}$ as at time t1. A charge quantity $QL_2$ is accumulated in the potential $\Phi_{32}$. At time t3 the signals P2V, TG2 are L level and the signal P1V is H level, whereby the potentials $\Phi_{37-1}$, $\Phi_{37-2}$, $\Phi_{38-1}$, $\Phi_{38-2}$, $\Phi_{39}$, $\Phi_{40}$ are shallow and the potentials $\Phi_{35-1}$, $\Phi_{35-2}$, $\Phi_{35-3}$, $\Phi_{36-1}$, $\Phi_{36-2}$, $\Phi_{36-3}$ of the n-type semiconductor layers 35 and the n-type semiconductor layers 36 are deep, thus forming respective wells of the potentials $\Phi_{36-1}$, $\Phi_{36-2}$, $\Phi_{36-3}$. The charge accumulated in the well of the potential $\Phi_{34}$ is transferred into the well of the potential $\Phi_{36-1}$. The charge quantity $QL_1$ is accumulated in the potential $\Phi_{36-1}$.

At time t4, the signals MGL, MGH, TG1, P2V, TG2 are H level and the signal P1V is L level, to form the gradient of the potential $\Phi_{32}$ and the respective wells of the potentials $\Phi_{34}$, $\Phi_{38-1}$, $\Phi_{38-2}$, $\Phi_{40}$ as at time t2 (cf. FIG. 4 (d)). The charge accumulated in the well of the potential $\Phi_{32}$ is transferred along the gradient of the potential $\Phi_{32}$ into the well of the potential $\Phi_{34}$. The charge quantity $QL_2$ is accumulated in the potential $\Phi_{34}$. The charge accumulated in the well of the potential $\Phi_{36-1}$ is transferred into the well of the potential $\Phi_{38-1}$. The charge quantity $QL_1$ is accumulated in the potential $\Phi_{38-1}$.

At time t5, the signals MGL, MGH, TG1, P2V, TG2 are L level and the signal P1V is H level, to eliminate the gradient of the potential $\Phi_{32}$ and form the respective wells of the potentials $\Phi_{36-1}$, $\Phi_{36-2}$, $\Phi_{36-3}$ as at time t3 (cf. FIG. 4 (e)). This causes a generated charge to be accumulated in the well of the potential $\Phi_{32}$ as at times t1 and t3. A charge quantity $QL_3$ is accumulated in the potential $\Phi_{32}$. The charge accumulated in the well of the potential $\Phi_{34}$ is transferred into the well of the potential $\Phi_{36-1}$. The charge quantity $QL_2$ is accumulated in the potential $\Phi_{36-1}$. The charge accumulated in the well of the potential $\Phi_{38-1}$ is transferred into the well of the potential $\Phi_{36-2}$. The charge quantity $QL_1$ is accumulated in the potential $\Phi_{36-2}$.

At time t6, the signals MGL, MGH, TG1, P2V, TG2 are H level and the signal P1V is L level, to form the gradient of the potential $\Phi_{32}$ and the respective wells of the potentials $\Phi_{34}$, $\Phi_{38-1}$, $\Phi_{38-2}$, $\Phi_{40}$ as at the times t2 and t4 (cf FIG. 4 (f)). The charge accumulated in the well of the potential $\Phi_{32}$ is transferred along the gradient of the potential $\Phi_{32}$ into the well of the potential $\Phi_{34}$. The charge quantity $QL_3$ is accumulated in the potential $\Phi_{34}$. The charge accumulated in the well of the potential $\Phi_{36-1}$ is transferred into the well of the potential $\Phi_{38-1}$. The charge quantity $QL_2$ is accumulated in the potential $\Phi_{38-1}$. The charge accumulated in the well of the potential $\Phi_{36-2}$ is transferred into the well of the potential $\Phi_{38-2}$. The charge quantity $QL_1$ is accumulated in the potential $\Phi_{38-2}$.

At time t7, in a state in which the signals MGL, MGH are H level, the signals TG1, P2V, TG2 are L level and the signal P1V is H level, whereby the state in which the gradient of the potential $\Phi_{32}$ is formed is maintained, but the potential $\Phi_{33}$ is shallow; therefore a generated charge is accumulated in the well of the potential $\Phi_{32}$. A charge quantity $QL_4$ is accumulated in the potential $\Phi_{32}$ (cf. FIG. 4 (g)). At time t7, the respective wells of the potentials $\Phi_{36-1}$, $\Phi_{36-2}$, $\Phi_{36-3}$ are formed. The charge accumulated in the well of the potential $\Phi_{34}$ is transferred into the well of the potential $\Phi_{36-1}$. The charge quantity $QL_3$ is accumulated in the potential $\Phi_{36-1}$. The charge accumulated in the well of the potential $\Phi_{38-1}$ is transferred into the well of the potential $\Phi_{36-2}$. The charge quantity $QL_2$ is accumulated in the potential $\Phi_{36-2}$. The charge accumulated in the well of the potential $\Phi_{38-2}$ is transferred into the well of the potential $\Phi_{36-3}$. The charge quantity $QL_1$ is accumulated in the potential $\Phi_{36-3}$.

At time t8, the signals MGL, MGH, TG1, P2V, TG2, P1H are H level and the signal P1V is L level, to form the respective wells of the potentials $\Phi_{34}$, $\Phi_{38-1}$, $\Phi_{38-2}$, $\Phi_{40}$ (cf. FIG. 4 (h)). The charge accumulated in the well of the potential $\Phi_{32}$ is transferred along the gradient of the potential $\Phi_{32}$ into the well of the potential $\Phi_{34}$. The charge quantity $QL_4$ is accumulated in the potential $\Phi_{34}$. The charge accumulated in the well of the potential $\Phi_{36-1}$ is transferred into the well of the potential $\Phi_{38-1}$. The charge quantity $QL_3$ is accumulated in the potential $\Phi_{38-1}$. The charge accumulated in the well of the potential $\Phi_{36-2}$ is transferred into the well of the potential $\Phi_{38-2}$. The charge quantity $QL_2$ is accumulated in the potential $\Phi_{38-2}$. The charge accumulated in the well of the potential $\Phi_{36-3}$ is transferred into the well of the potential $\Phi_{40}$. The charge quantity $QL_1$ is accumulated in the potential $\Phi_{40}$. Since at time t8 the signal P1H is H level, the respective potentials $\Phi_{41}$, $\Phi_{42}$ of the n$^-$-type semiconductor layer 41 and the n-type semiconductor layer 42 are deep to form a well of the potential $\Phi_{42}$.

At time t9, in a state in which the signals MGL, MGH, P1H are H level, the signals TG1, P2V, TG2 are L level and the signal P1V is H level, a generated charge is accumulated in the well of the potential $\Phi_{32}$ in the state in which the gradient of the potential $\Phi_{32}$ is formed, as at time t7. A charge quantity $QL_5$ is accumulated in the potential $\Phi_{32}$ (cf. FIG. 5 (a)). At time t9, the respective wells of the potentials $\Phi_{36-1}$, $\Phi_{36-2}$, $\Phi_{36-3}$ are formed as at time t7. The charge accumulated in the well of the potential $\Phi_{34}$ is transferred into the well of the potential $\Phi_{36-1}$. The charge quantity $QL_4$ is accumulated in the potential $\Phi_{36-1}$. The charge accumulated in the well of the potential $\Phi_{38-1}$ is transferred into the well of the potential $\Phi_{36-2}$. The charge quantity $QL_3$ is accumulated in the potential $\Phi_{36-2}$. The charge accumulated in the well of the potential $\Phi_{38-2}$ is transferred into the well of the potential $\Phi_{36-3}$. The charge quantity $QL_2$ is accumulated in the potential $\Phi_{36-3}$. Since at time t9 the potentials $\Phi_{39}$, are shallow, the charge accumulated in the well of the potential $\Phi_{40}$ is transferred into the well of the potential $\Phi_{42}$. The charge quantity $QL_1$ is accumulated in the potential $\Phi_{42}$.

At time t10, the signals MGL, MOH, TG1, P2V, TG2, P1H are H level and the signal P1V is L level, to form the respective wells of the potentials $\Phi_{34}$, $\Phi_{38-1}$, $\Phi_{38-2}$, $\Phi_{40}$ as at time t8 (cf. FIG. 5 (b)). The charge accumulated in the well of the potential $\Phi_{32}$ is transferred along the gradient of the potential $\Phi_{32}$ into the well of the potential $\Phi_{34}$. The charge quantity $QL_5$ is accumulated in the potential $\Phi_{34}$. The charge accumulated in the well of the potential $\Phi_{36-1}$ is transferred into the well of the potential $\Phi_{38-1}$. The charge quantity $QL_4$ is accumulated in the potential $\Phi_{38-1}$. The charge accumulated in the well of the potential $\Phi_{36-2}$ is transferred into the well of the potential $\Phi_{38-2}$. The charge quantity $QL_3$ is accumulated in the potential $\Phi_{38-2}$. The charge accumulated in the well of the potential $\Phi_{36-3}$ is transferred into the well of the potential $\Phi_{40}$. The charge quantity $QL_2$ is accumulated in the potential $\Phi_{40}$.

At time t11, in the state in which the signals MGL, MGH, P1H are H level, the signals TG1, P2V, TG2 are L level and the signal PIN is H level, whereby a generated charge is accumulated in the well of the potential $\Phi_{32}$ in the state in which the gradient of the potential $\Phi_{32}$ is formed, as at time t9. A charge quantity $QL_6$ is accumulated in the potential $\Phi_{32}$ (cf. FIG. 5 (c)). At time t11, the respective wells of the potentials $\Phi_{36-1}$, $\Phi_{36-2}$, $\Phi_{36-3}$ are formed as at time t9. The charge accumulated in the well of the potential $\Phi_{34}$ is transferred into the well of the potential $\Phi_{36-1}$. The charge quantity $QL_5$ is accumulated in the potential $\Phi_{36-1}$. The charge accumulated in the well of the potential $\Phi_{38-1}$ is transferred into the well of the potential $\Phi_{36-2}$. The charge quantity $QL_4$ is accumulated in the potential $\Phi_{36-2}$. The charge accumulated in the well of the potential $\Phi_{38-2}$ is transferred into the well of the potential $\Phi_{36-3}$. The charge quantity $QL_3$ is accumulated in the potential $\Phi_{36-3}$. The charge accumulated in the well of the potential $\Phi_{40}$ is transferred into the well of the potential $\Phi_{42}$. The charge quantity $QL_1$ plus the charge quantity $QL_2$ are accumulated in the potential $\Phi_{42}$.

At time t12, the signals MGL, MGH, TG1, P2V, TG2, P1H are H level and the signal P1V is L level, to form the respective wells of the potentials $\Phi_{34}$, $\Phi_{38-1}$, $\Phi_{38-2}$, $\Phi_{40}$ as at time t8 (cf. FIG. 5 (d)). The charge accumulated in the well of the potential $\Phi_{32}$ is transferred along the gradient of the potential $\Phi_{32}$ into the well of the potential $\Phi_{34}$. The charge quantity $QL_6$ is accumulated in the potential $\Phi_{14}$. The charge accumulated in the well of the potential $\Phi_{36-1}$ is transferred into the well of the potential $\Phi_{38-1}$. The charge quantity $QL_1$ is accumulated in the potential $\Phi_{38-1}$. The charge accumulated in the well of the potential $\Phi_{36-2}$ is transferred into the well of the potential $\Phi_{38-2}$. The charge quantity $QL_4$ is accumulated in the potential $\Phi_{38-2}$. The charge accumulated in the well of the potential $\Phi_{36-3}$ is transferred into the well of the potential $\Phi_{40}$. The charge quantity $QL_3$ is accumulated in the potential $\Phi_{40}$.

At time t13, in a state in which the signal P1H is H level, the signals MGL, MGH, TG1, P2V, TG2 are L level and the signal P1V is H level, to eliminate the gradient of the potential $\Phi_{32}$ and to accumulate a newly generated charge in the well of the potential $\Phi_{32}$ (cf, FIG. 5 (e)). At time t13, the respective wells of the potentials $\Phi_{36-1}$, $\Phi_{36-2}$, $\Phi_{36-3}$ are formed as at time t9. The charge accumulated in the well of the potential $\Phi_{34}$ is transferred into the well of the potential $\Phi_{36-1}$. The charge quantity $QL_6$ is accumulated in the potential $\Phi_{36-1}$. The charge accumulated in the well of the potential $\Phi_{38-1}$ is transferred into the well of the potential $\Phi_{36-2}$. The charge quantity $QL_5$ is accumulated in the potential $\Phi_{36-2}$. The charge accumulated in the well of the potential $\Phi_{38-2}$ is transferred into the well of the potential $\Phi_{36-3}$. The charge quantity $QL_4$ is accumulated in the potential $\Phi_{36-3}$. The charge accumulated in the well of the potential $\Phi_{40}$ is transferred into the well of the potential $\Phi_{42}$.

At time t13, the sum of the charge quantities $QL_1$, $QL_2$, $QL_3$, including the charge transferred from the potential $\Phi_{40}$, is accumulated in the potential $\Phi_{42}$. After this, the charge in the sum of the charge quantities $QL_1$, $QL_2$, $QL_3$ is sequentially transferred in the second direction during a charge transferring period TP1 to be output to the amplifier portion 21. Although omitted from the illustration in FIG. 3, a signal for transferring the sum of charge quantities $QL_1$, $QL_2$, $QL_3$ in the second direction is given as signal P1H during the charge transferring period TP1.

Subsequently, at time t14, in a state in which the signal P1H is H level and in which the signals MGL, MOH, TG1 are L level, the signal P1V is L level and the signals P2V, TG2 are H level, to form the respective wells of the potentials $\Phi_{38-1}$, $\Phi_{38-2}$, $\Phi_{40}$ (ef. FIG. 5 (f)). The charge accumulated in the well of the potential $\Phi_{36-1}$ is transferred into the well of the potential $\Phi_{38-1}$. The charge quantity $QL_6$ is accumulated in the potential $\Phi_{38-1}$. The charge accumulated in the well of the potential $\Phi_{36-2}$ is transferred into the well of the potential $\Phi_{38-2}$. The charge quantity $QL_5$ is accumulated in the potential $\Phi_{38-2}$. The charge accumulated in the well of the potential $\Phi_{36-3}$ is transferred into the well of the potential $\Phi_{40}$. The charge quantity $QL_4$ is accumulated in the potential $\Phi_{40}$.

At time t15, in a state in which the signal P1H is H level and in which the signals MGL, MGH, TG1 are L level, the signals P2Y, TG2 are L level and the signal P1V is H level, to form the respective wells of the potentials $\Phi_{36-1}$, $\Phi_{36-2}$, $\Phi_{36-3}$ (cf. FIG. 5 (g)). The charge accumulated in the well of the potential $\Phi_{38-1}$ is transferred into the well of the potential $\Phi_{36-2}$. The charge quantity $QL_6$ is accumulated in the potential $\Phi_{36-2}$. The charge accumulated in the well of the potential $\Phi_{38-2}$ is transferred into the well of the potential $\Phi_{36-3}$. The charge quantity $QL_5$ is accumulated in the potential $\Phi_{36-3}$. The charge accumulated in the well of the potential $\Phi_{40}$ is transferred into the well of the potential $\Phi_{42}$. The charge quantity $QL_4$ is accumulated in the potential $\Phi_{42}$.

After that, the operations corresponding to the times t14, t15 are repeatedly carried out and at time t16, the respective charges accumulated in the potentials $\Phi_{36-2}$, $\Phi_{36-3}$ are transferred into the well of the potential $\Phi_{42}$ (cf. FIG. 5 (h)). At time t16, the sum of charge quantities $QL_4$, $QL_5$, $QL_6$ is accumulated in the potential $\Phi_{42}$. After this, the charge in the sum of charge quantities $QL_4$, $QL_5$, $QL_6$ is sequentially transferred in the second direction during a charge transferring period TP2 to be output to the amplifier portion 21. Although omitted from the illustration in FIG. 3, a signal for transferring the sum of charge quantities $QL_4$, $QL_5$, $QL_6$ in the second direction is given as signal P1H during the charge transferring period TP2.

In the present embodiment, as described above, the planar shape of the photosensitive region 13 is the nearly rectangular shape composed of two long sides and two short sides. In this case, the length in the long side direction of the photosensitive region 13 can be made long to increase a saturated charge quantity in each photosensitive region 13, thereby enabling an improvement in SN ratio.

The plurality of photoelectric converting portions 3 are juxtaposed along the second direction intersecting with the first direction and are arranged in the array form in the one-dimensional direction. In the present embodiment the plurality of photoelectric converting portions 3 are juxtaposed in the direction along the short side direction of the photosensitive region 13. Since in each photoelectric converting portion 3 the potential gradient increasing along the first direction is formed by the electrode 51, the charge generated in the photosensitive region 13 migrates toward the other short side along the slope of potential according to the potential gradient formed. The charge having migrated to the other short side is acquired by the first transferring portion 5 to be transferred in the first direction. This makes the charge migration speed dominated by the potential gradient (slope of potential), so as to increase the charge readout speed.

In the present embodiment, the charge transferred from the first transferring portion 5 is accumulated in the charge accumulating portion 7 and then is transferred in the first direction by the second transferring portion 9. Then the charges transferred from the respective second transferring portions 9 are transferred in the second direction and output by the shift register 11. As a consequence of this, the solid-state imaging device 1 does not have to execute further signal processing for obtaining a one-dimensional image, whereby the image processing can be prevented from becoming complicated.

In the present embodiment, the photosensitive region 13 has the planar shape of the nearly rectangular shape composed of two long sides and two short sides. As a result of this, the saturated charge quantity in the photosensitive region 13 is large.

In the present embodiment, the charge (the sum of charge quantities $QL_1$, $QL_2$, $QL_3$) generated in the photoelectric converting portion 3 (photosensitive region 13) during the first period (period T1 in FIG. 3) and the charge (the sum of charge quantities $QL_4$, $QL_5$, $QL_6$) generated in the photoelectric converting portion 3 (photosensitive region 13) during the second period (period T2 in FIG. 3) shorter than the first period T1 are continuously and alternately output. Namely, in the present embodiment, the sum of the first period T1 and the second period T2 is defined as one readout period, in which charges generated in the photoelectric converting portion 3 are accumulated and output. In the present embodiment, the charge generated in the photoelectric converting portion 3 during the first period is read out in the charge transferring period TP1 and the charge generated in the photoelectric converting portion 3 during the second period is read out in the charge transferring period TP2. In the present embodiment, the first period T1 is set, for example, at about 9.99 ms, the second period T2 is set, for example, at about 10 μs, and thus the first period T1 is approximately 1000 times the second period T2.

In the case where the first period T1 is set at 9.99 ins and the second period T2 at 10 μs, when the charge quantity generated in the photoelectric converting portion 3 during the first period T1 is saturated, the output from the solid-state imaging device 1 may be defined as 1000 times an output based on the charge quantity generated in the photoelectric converting portion 3 during the second period T2. If the charge quantity generated in the photoelectric converting portion 3 during the first period T1 is not saturated, the output from the solid-state imaging device 1 may be defined as an output based on the sum of the charge quantity generated in the photoelectric converting portion 3 during the first period T1 and the charge quantity generated in the photoelectric converting portion 3 during the second period T2.

When the charge generated in the photoelectric converting portion 3 during the first period T1 is accumulated, since the exposure time is relatively long, strong incident light results in saturation of a signal and this makes appropriate detection difficult. In contrast to it, weak incident light is detected as a sufficiently large signal. On the other hand, when the charge generated in the photoelectric converting portion 3 during the second period T2 is accumulated, since the exposure time is relatively short, weak incident light results in a very weak signal and this makes sufficient signal detection difficult. In contrast to it, strong incident light is appropriately detected as a signal, without saturation. As described above, the solid-state imaging device 1 appropriately detects the incident light as a signal, regardless of the intensity of incident light, so as to increase the effective dynamic range.

In the present embodiment, the device is provided with the charge accumulating portions 7. This allows the charge generated in the photoelectric converting portion 3 during the first period T1 to be accumulated and transferred through the second transferring portion 9 to the shift register 11 so as to cause no impediment in transferring the charge generated in the photoelectric converting portion 3 during the second period T2.

The above described the preferred embodiment of the present invention, but it should be noted that the present invention is by no means intended to be limited to the above-described embodiment but can be modified in various ways without departing from the scope and spirit of the invention.

In the present embodiment, there are the five pairs of electrodes 55-58 arranged in the charge accumulating portion 7, but, without having to be limited to this, it is also possible to arrange more than five pairs of electrodes.

Industrial Applicability

The present invention is applicable to the light detecting means of the spectroscope.

The invention claimed is:
1. A solid-state imaging device comprising:
a plurality of photoelectric converting portions, each having a photosensitive region which generates a charge according to incidence of light and which has a planar shape of a nearly rectangular shape composed of two long sides and two short sides, and a potential gradient forming region which forms a potential gradient increasing along a first direction directed from one short side to the other short side forming the planar shape of the photosensitive region, in the photosensitive region, said plurality of photoelectric converting portions being juxtaposed along a second direction intersecting with the first direction;

a plurality of first transferring portions arranged corresponding to the respective photoelectric converting portions and on the side of the other short side fanning the planar shape of the photosensitive region, each first transferring portion transferring a charge acquired from the photosensitive region of the corresponding photoelectric converting portion, in the first direction;

a plurality of charge accumulating portions arranged corresponding to the respective first transferring portions, each charge accumulating portion accumulating a charge transferred from the corresponding first transferring portion;

a plurality of second transferring portions arranged corresponding to the respective charge accumulating portions, each second transferring portion transferring a charge accumulated in the corresponding charge accumulating portion, in the first direction; and a charge output portion arranged to the plurality of second transferring portions, said charge output portion transferring and outputting charges transferred from the respective second transferring portions, in the second direction.

2. The solid-state imaging device according to claim 1, wherein a charge generated in the photoelectric converting portion during a first period and a charge generated in the photoelectric converting portion during a second period shorter than the first period are continuously and alternately output.

* * * * *

UNITED STATES PATENT AND TRADEMARK OFFICE
CERTIFICATE OF CORRECTION

PATENT NO.       : 8,415,604 B2                                                                 Page 1 of 1
APPLICATION NO.  : 12/933992
DATED            : April 9, 2013
INVENTOR(S)      : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 379 days.

Signed and Sealed this

First Day of September, 2015

Michelle K. Lee
*Director of the United States Patent and Trademark Office*